United States Patent [19]
Tsuchida et al.

[11] Patent Number: 5,062,079
[45] Date of Patent: Oct. 29, 1991

[54] MOS TYPE RANDOM ACCESS MEMORY WITH INTERFERENCE NOISE ELIMINATOR

[75] Inventors: Kenji Tsuchida, Kawasaki; Yukihito Oowaki, Yokohama, both of Japan

[73] Assignee: Kabushiki Kaisha Toshiba, Kawasaki, Japan

[21] Appl. No.: 412,930

[22] Filed: Sep. 26, 1989

[30] Foreign Application Priority Data

Sep. 28, 1988 [JP] Japan .................................. 63-242919
Sep. 28, 1988 [JP] Japan .................................. 63-242920

[51] Int. Cl.$^5$ ............................................ G11C 11/34
[52] U.S. Cl. ..................................... 365/210; 365/203; 365/149
[58] Field of Search ............... 365/203, 206, 207, 208, 365/210, 149

[56] References Cited

U.S. PATENT DOCUMENTS

4,379,344  4/1983  Ozawa et al. ......................... 365/203
4,667,311  5/1987  Ulhaq ................................... 365/182

FOREIGN PATENT DOCUMENTS

0264929   4/1988  European Pat. Off. .
63-42095   2/1988  Japan .
63-104296  5/1988  Japan .
1-130392   5/1989  Japan .
2114811   8/1983  United Kingdom .

Primary Examiner—Joseph A. Popek
Attorney, Agent, or Firm—Oblon, Spivak, McClelland, Maier & Neustadt

[57] ABSTRACT

A MOS type random access memory disclosed has a plurality of pairs of sequentially aligned folded type bit lines each of which has a first bit line and a second bit line. Memory cells are arranged at points of intersection between a memory cell word line and the first bit lines. Dummy cells are arranged at points of intersection of a dummy cell word line and the second bit lines. Sense amplifier circuits are connected to the bit line pairs, respectively. In a data read mode of the memory, when a bit data is read from a certain memory cell which is connected to a first word line selected and a first bit line of a selected bit line pair, a second bit line onto which a data voltage is read from a dummy cell of the selected bit line pair is forcedly fixed to a precharge voltage produced by a precharge voltage generator in a presented time interval after the first word line is selected and before a certain sense amplifier circuit connected to the selected bit line pair gets activated, whereby interference noise may be eliminated which is introduced onto the selected bit line pair from a bit line pair adjacent to the selected bit line pair.

10 Claims, 15 Drawing Sheets

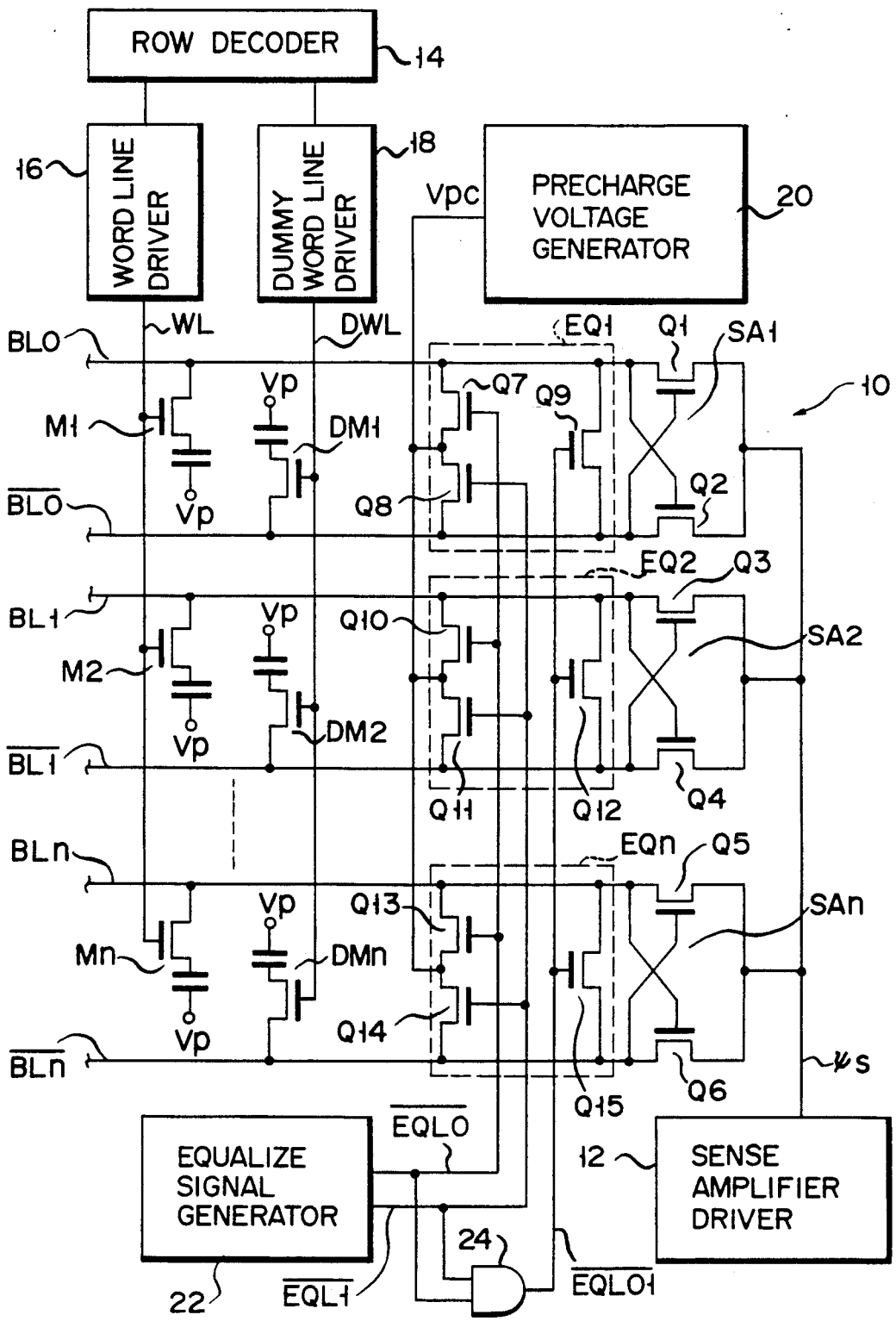
F I G. 3

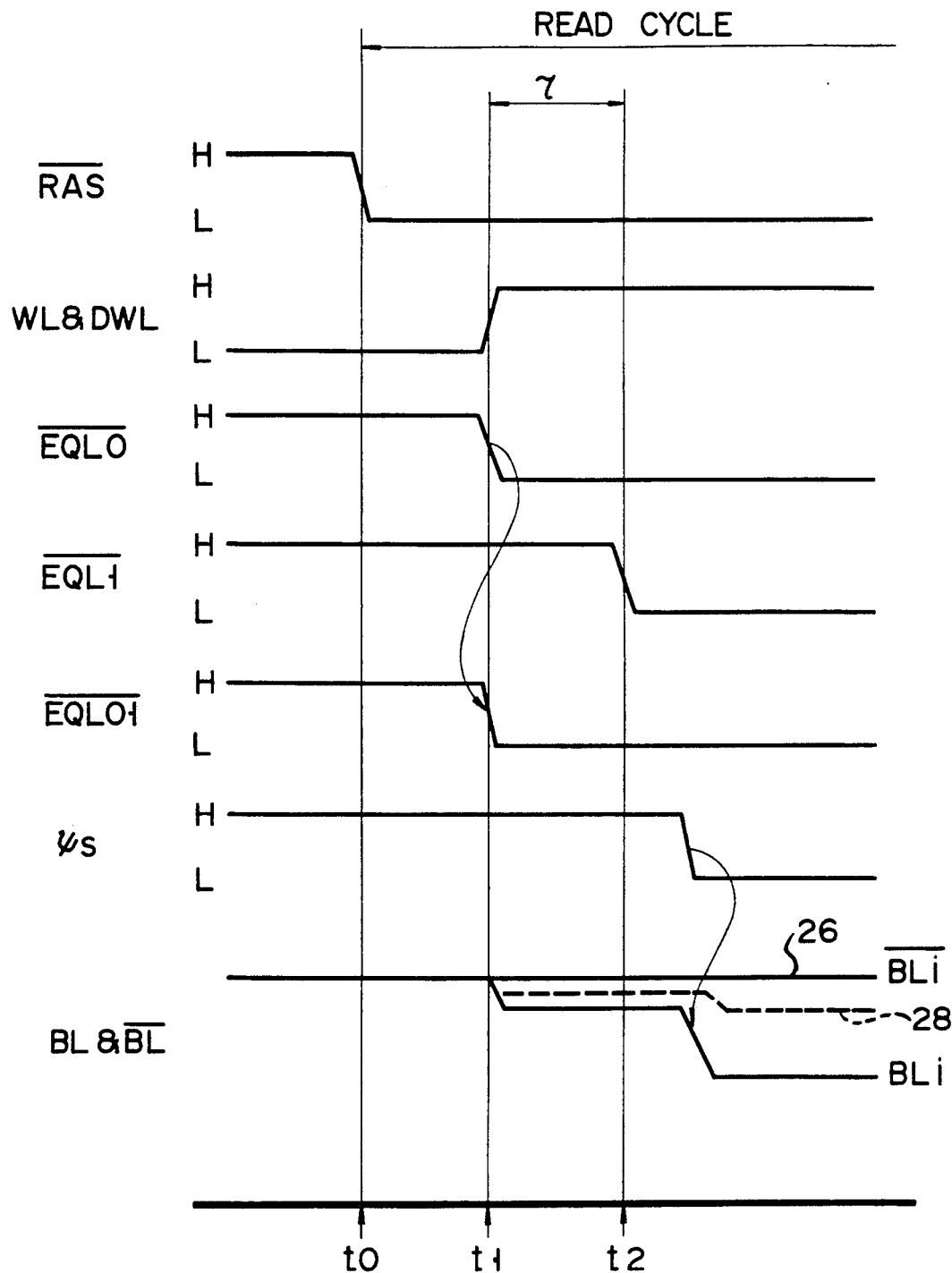
F I G. 4

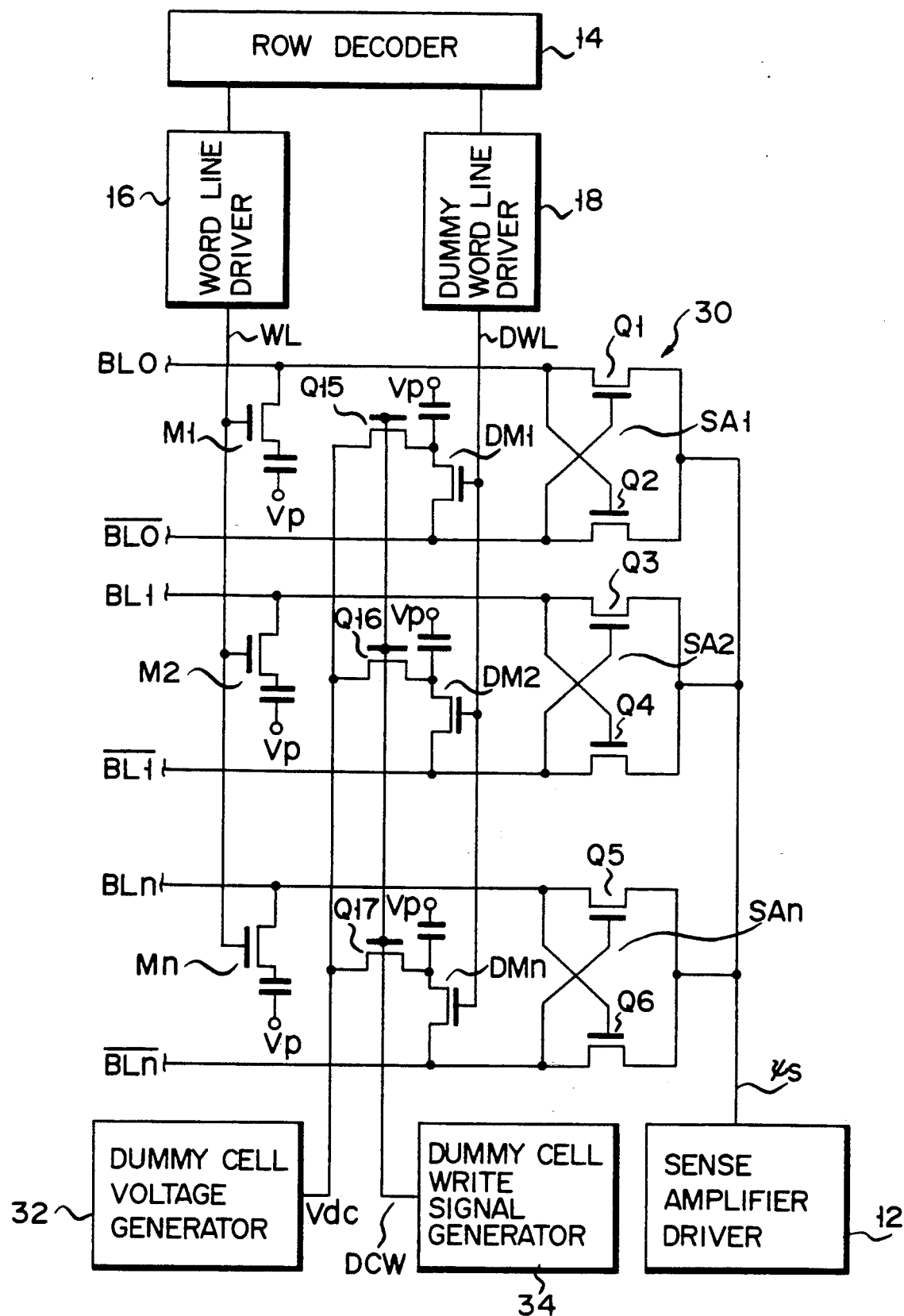
F I G. 5

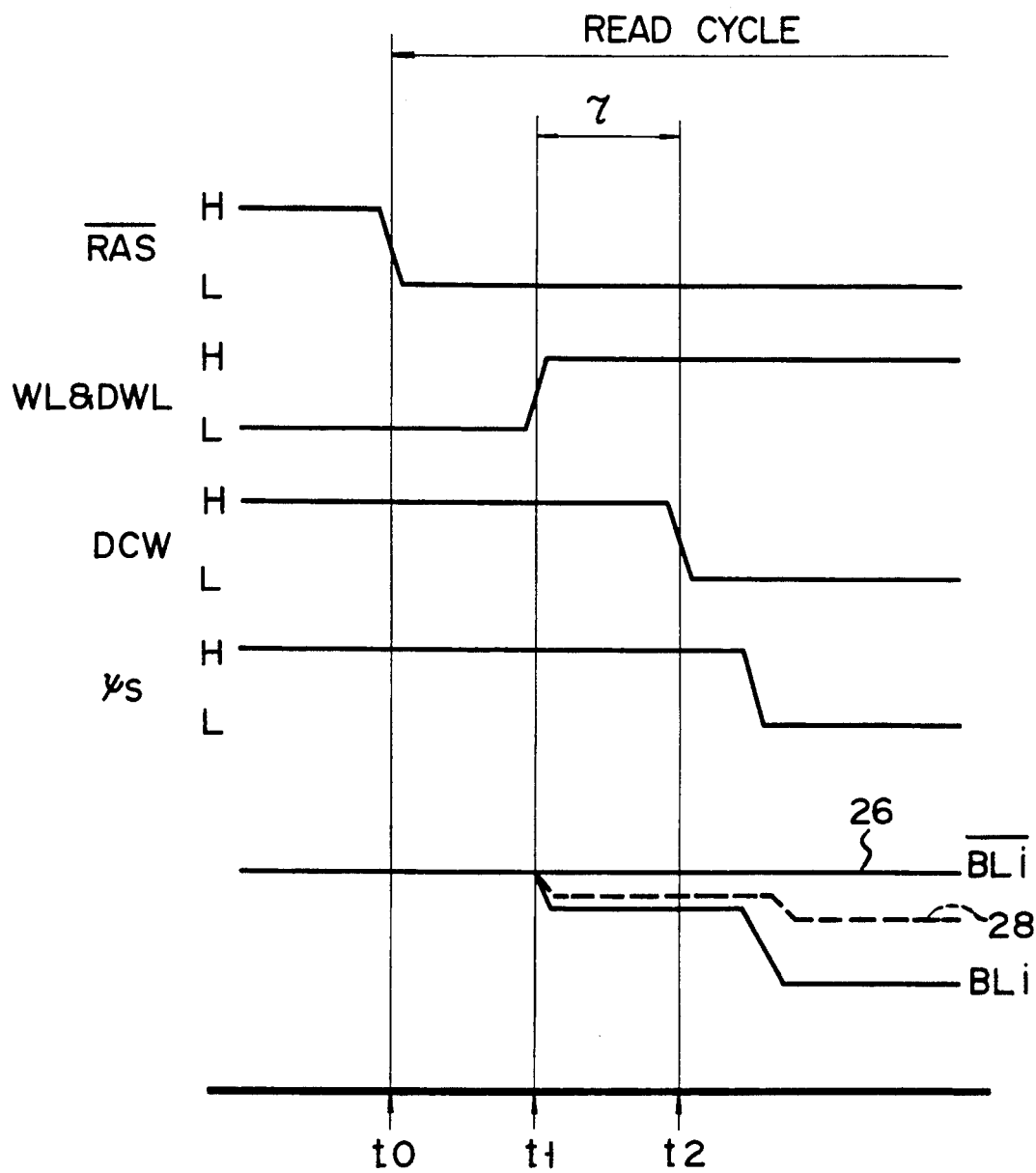
F I G. 6

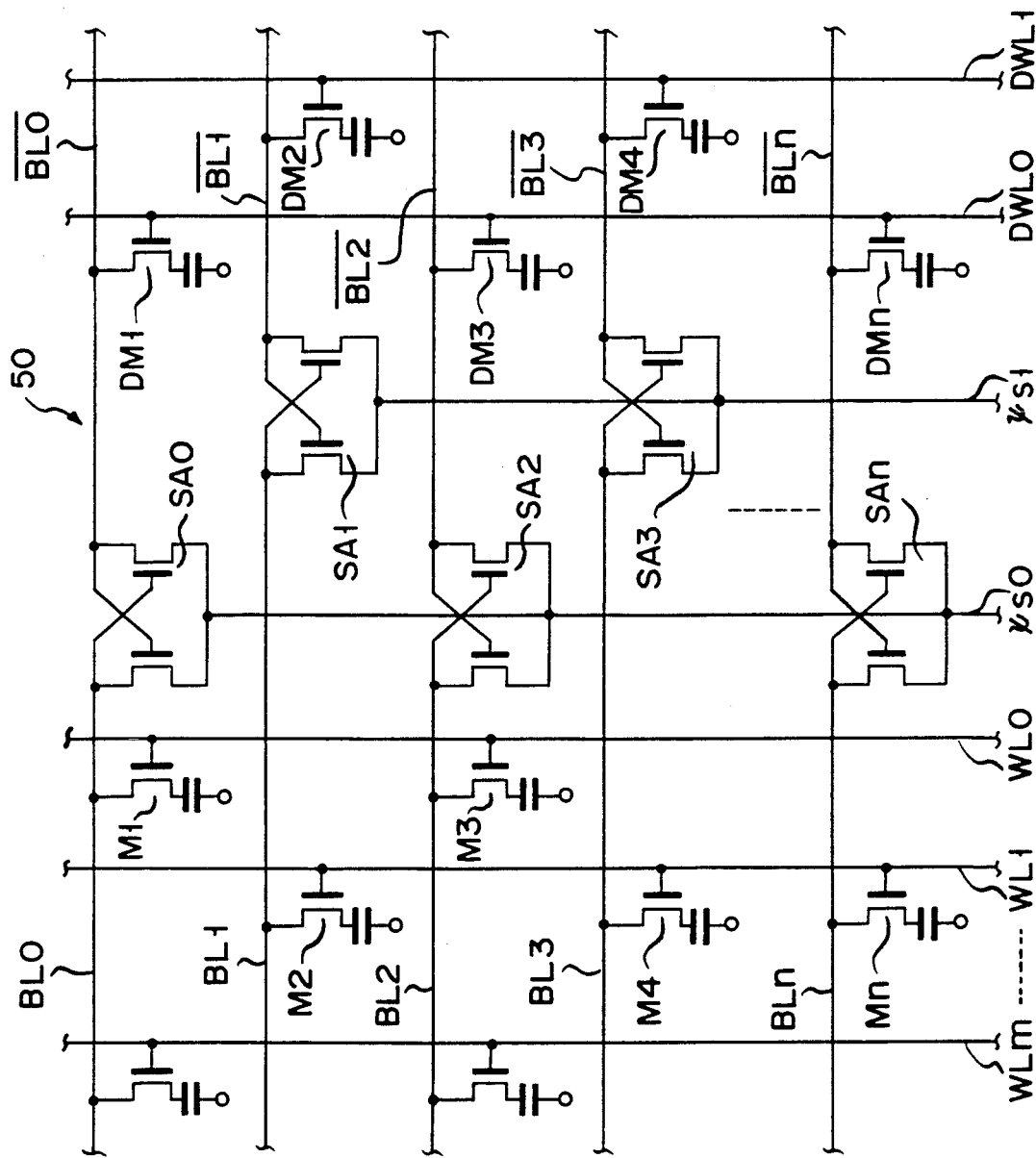
F I G. 7

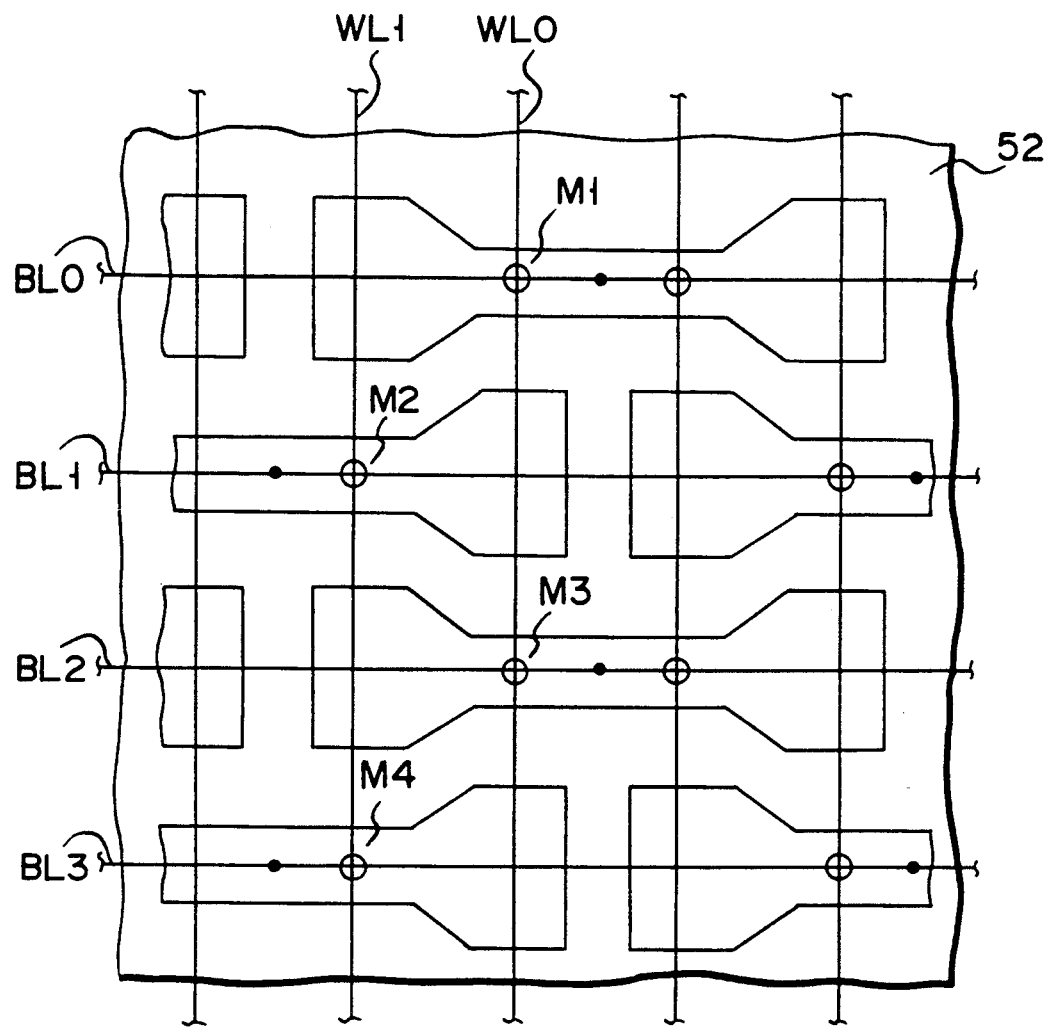
F I G. 9

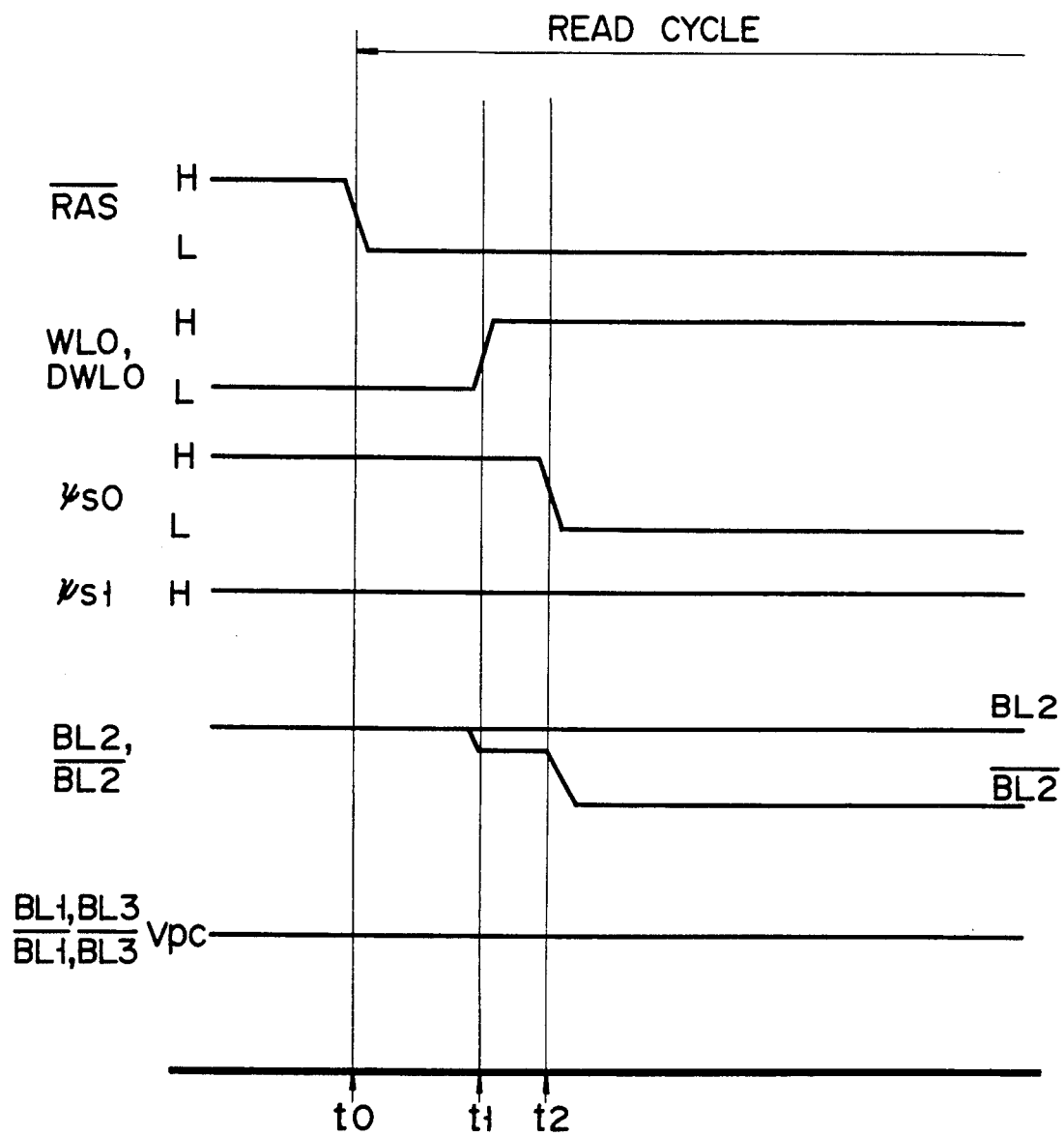
F I G. 10

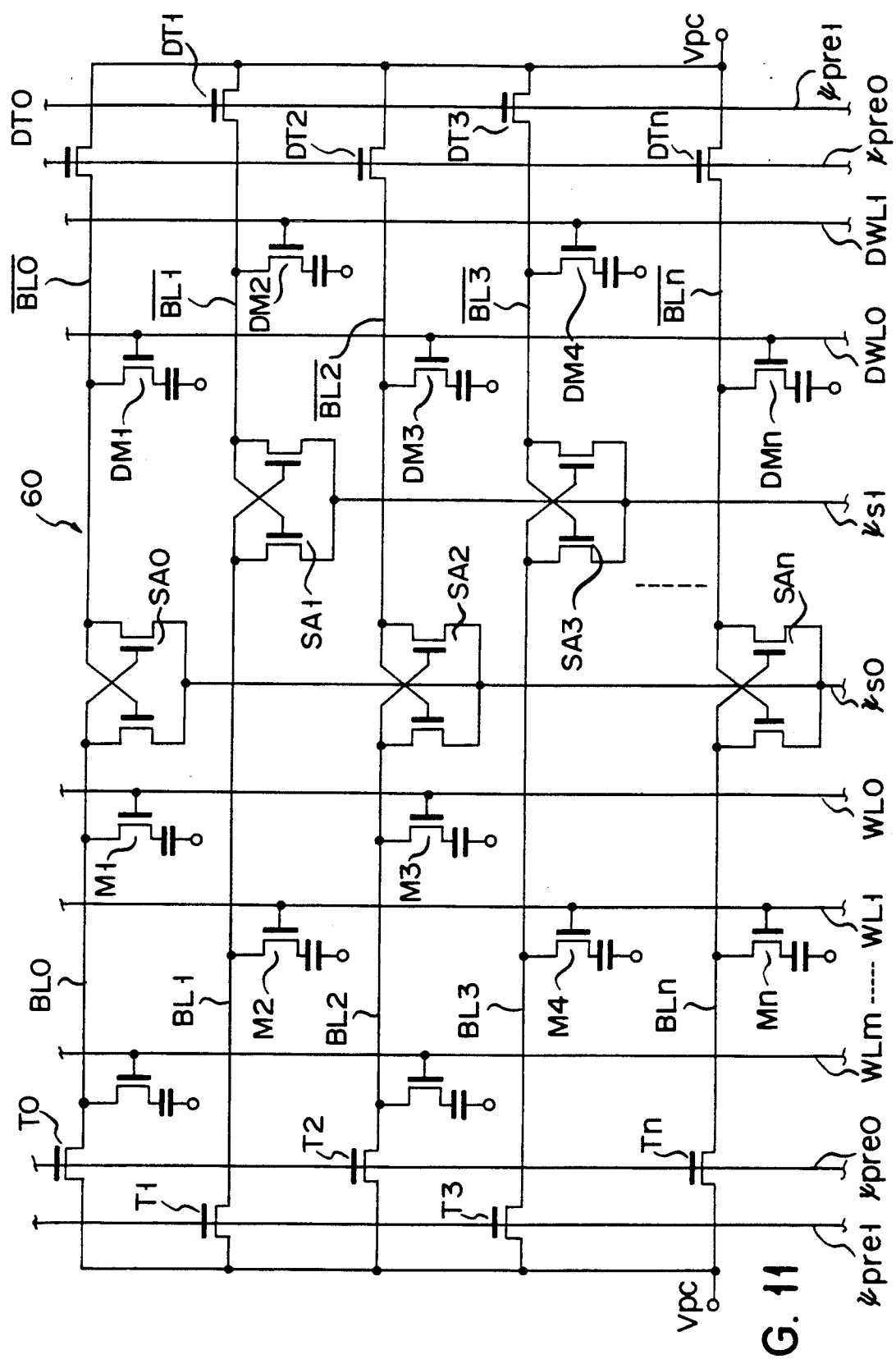
F I G. 11

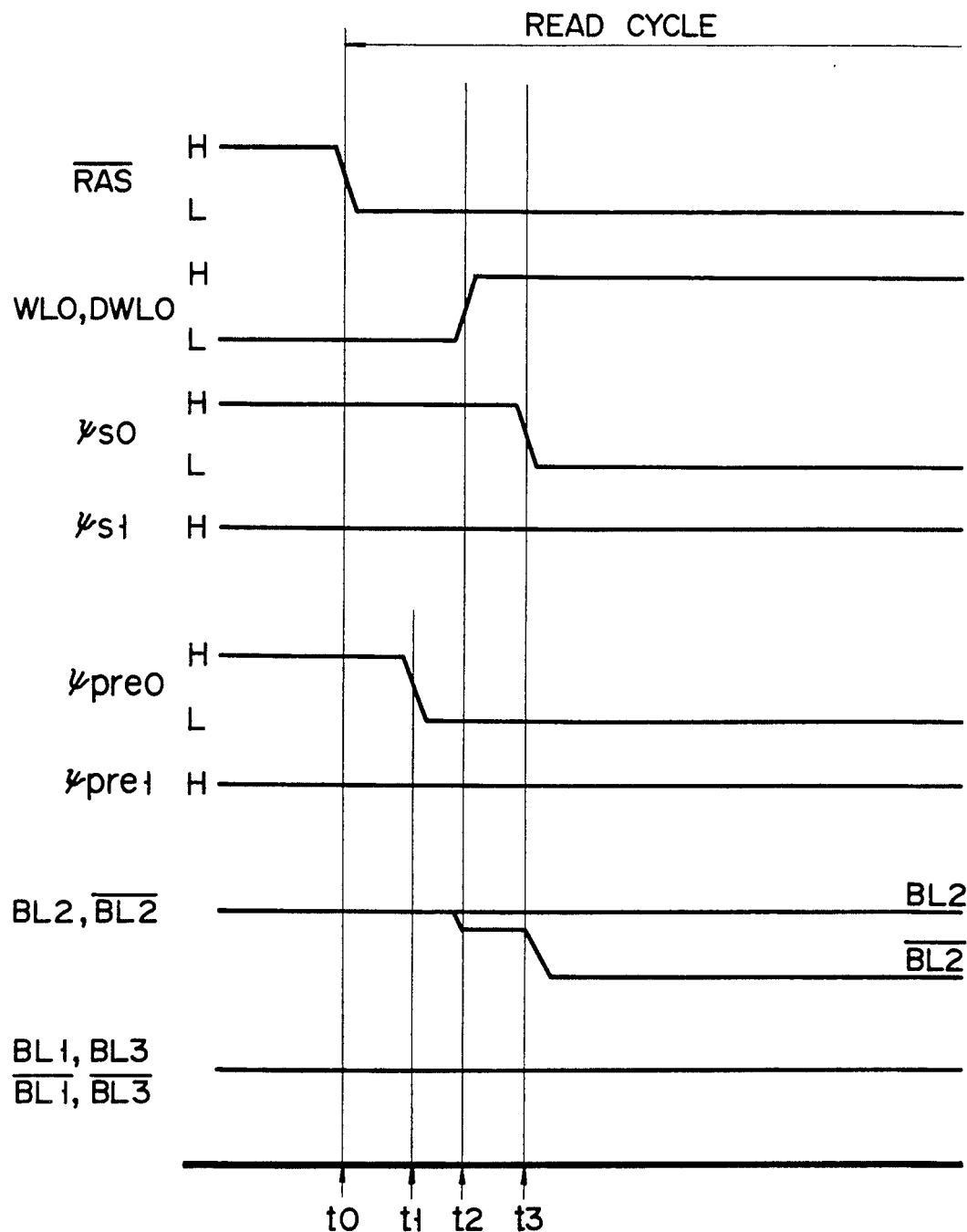
F I G. 12

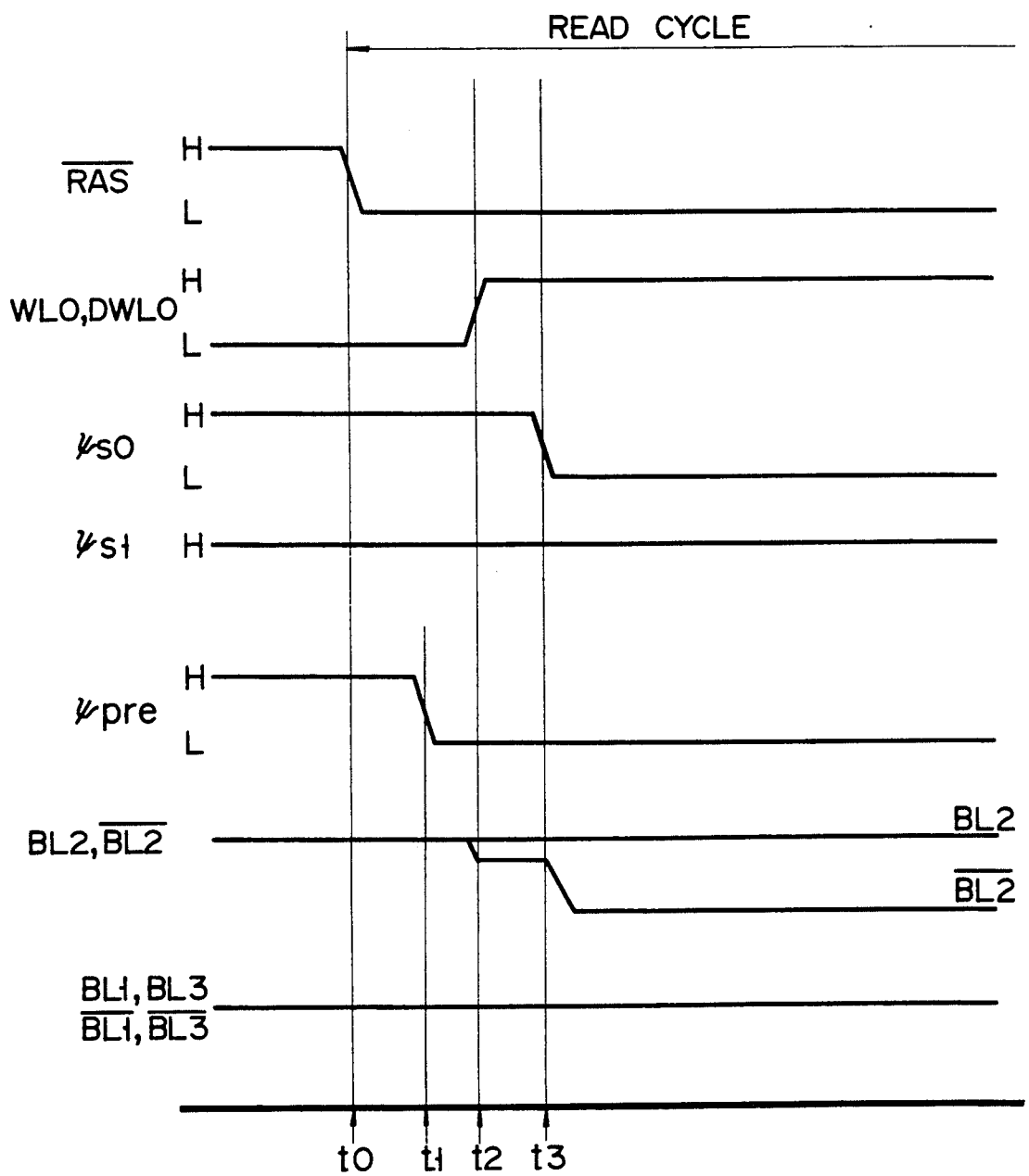
F I G. 14

MOS TYPE RANDOM ACCESS MEMORY WITH INTERFERENCE NOISE ELIMINATOR

BACKGROUND OF THE INVENTION

1. Field of the Invention

The present invention relates to semiconductor memory devices and, more particularly, to a dynamic random access memory having memory cells each of which has a single transistor and a single capacitive element.

2. Description of the Related Art

With the increasing needs for high performance of digital systems, the current development thrust of random access memories (referred to as "DRAMs" hereinafter) is toward dramatic density improvement. The improvement of the integration density of DRAMs will require decrease in the size of each memory cell of the DRAMs. The manufacture of miniaturized memory cells has been significantly improved recently in large part of role played by advanced micro-fabrication technology.

Unfortunately, in presently available DRAMs, a coupling capacitance which is inherently present between neighboring data transfer lines arranged in the planar matrix of memory cells, increases in accordance with increase in the integration density of memory cells in the DRAMs. The presence of the increased coupling capacitance strengthens the intensity of interference noise produced by a data transfer line adjacent to a data line being subjected to data reading and applied onto the data reading line. Such undesirable phenomenon have been reported in many research papers. For example, according to Papers of International Solid State Circuits Committee (ISSCC) Feb. 19, 1988 at pages 250, 251, 391 and 392, it has been demonstrated that the noise interference between internal data lines called "bit lines" tends to be increased not only when a cell storage data is being read onto the corresponding bit line, but also when the read data is being sensed and amplified by a sense amplifier circuit.

A significant disadvantage of the conventional DRAM is that the interference noise between the neighboring bit lines undesirably increases the time required for cell data amplification in a selected bit line, and the necessary sensing time becomes longer. This results in the high-speed data accessing being damaged seriously in the DRAM. In the worst case, the potential difference between a read data voltage and a corresponding dummy cell voltage to be input to the sense amplifier decreases below the minimum level of voltage that can be sensed by the sense amplifier. This leads to an accidental malfunction that the sense amplifier latches the memory cell data input thereto. The DRAM is unreliable in that many sense amplifiers arranged in bit line pairs may experience serious misjudgment on logical level of the read data, generating bit reading errors in the memory.

SUMMARY OF THE INVENTION

It is therefore an object of the present invention to provide a new and improved dynamic semiconductor memory device which is capable of operating at high speed and yet exhibits a reliable data reading operations.

In accordance with the above object, the present invention is addressed to a specific semiconductor memory device which comprises a plurality of pairs of parallel data transfer lines which may also be referred to hereinafter as "bit lines," parallel word lines insulatively intersecting the data lines, and memory cells arranged at points of intersection between the data lines and the word lines. The data line pairs include a selected data line pair having a first data transfer line for receiving a data voltage which is read from a selected memory cell connected to a specific word line selected from said word lines, and a second data transfer line for receiving a reference voltage. A sense amplifier unit is connected to the data line pairs, respectively, for getting activated in response to an activation signal supplied thereto to sense a voltage difference between the first and second data lines. The memory device is provided with a noise eliminator which makes a data line neighboring upon the first data line electrically insensitive during a preselected time period after the specific word line is selected and before said sense amplifier unit is activated, thereby to suppress an impression of noise onto the selected pair of data transfer lines from a pair of data transfer lines neighboring, i.e., adjacent, thereto due to a coupling capacitance therebetween.

The present invention and its objects and advantages will become more apparent in a detailed description of preferred embodiments to be presented below.

BRIEF DESCRIPTION OF THE DRAWINGS

In the detailed description of preferred embodiments of the present invention presented below, reference is made to the accompanying drawings of which:

FIG. 3 is a schematic diagram of the main part of the internal circuit arrangement of metal oxide semiconductor (MOS) type dynamic random access memory (DRAM) in accordance with one preferred embodiment of the present invention;

FIG. 4 is a diagram showing waveforms of the main voltage signals generated at the main portions of the DRAM shown in FIG. 3 during a sense operation in a data read mode thereof;

FIG. 5 schematic diagram of the main part of the internal circuit arrangement of a MOS type DRAM in accordance with another embodiment of the present invention;

FIG. 6 is a diagram showing waveforms of the main voltage signals generated at the main portions of the DRAM shown in FIG. 5 during a sense operation in a data read mode thereof;

FIG. 7 is a schematic diagram of the main part of the internal circuit arrangement of an open bit line type DRAM in accordance with still another embodiment of the present invention;

FIG. 9 is another simplified plan views of the memory cell layout on a chip substrate which may also be used for the DRAM shown in FIG. 7;

FIG. 10 is a diagram showing waveforms of the main voltage signals generated at the main portions of the DRAM shown in FIG. 7 during a sense operation in a data read mode thereof;

FIG. 11 schematic diagram of the main part of the internal circuit arrangement of an open bit line type DRAM which is a modification of the embodiment of the present invention shown in FIG. 7;

FIG. 12 is a diagram showing waveforms of the main voltage signals generated at the main portions of the DRAM shown in FIG. 11 during a sense operation in a data read mode thereof;

FIG. 14 is a diagram showing waveforms of the main voltage signals generated at the main portions of the DRAM shown in FIG. 13 during a sense operation in a data read mode thereof;

DETAILED DESCRIPTION OF THE PREFERRED EMBODIMENTS

Figure 1:
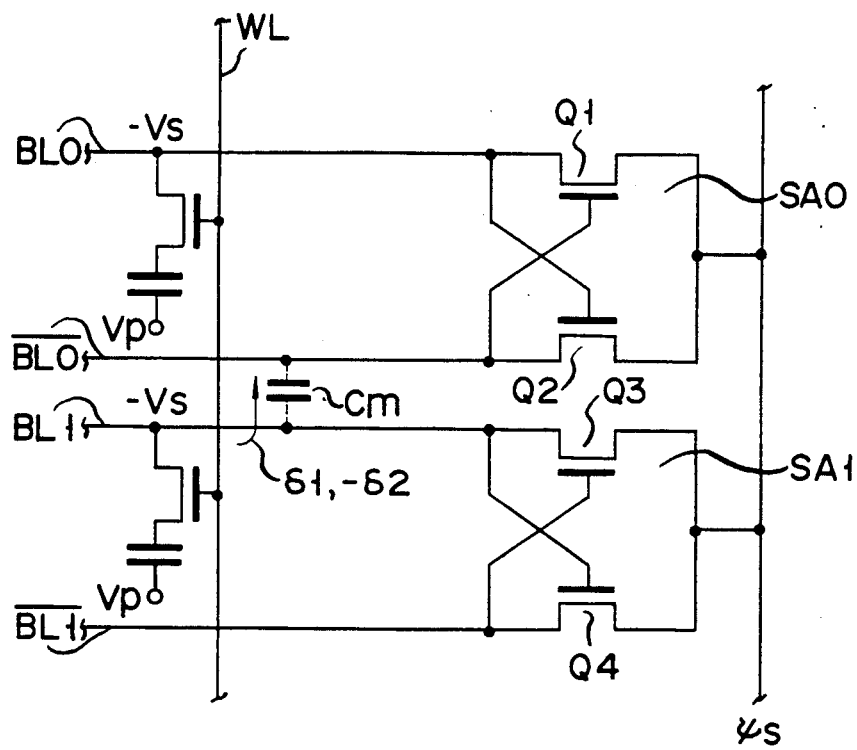
FIG. 1 is a schematic diagram of the main part of the internal circuit arrangement a metal oxide semiconductor (MOS) type dynamic random access memory (DRAM) of the prior art.
Figure 2:
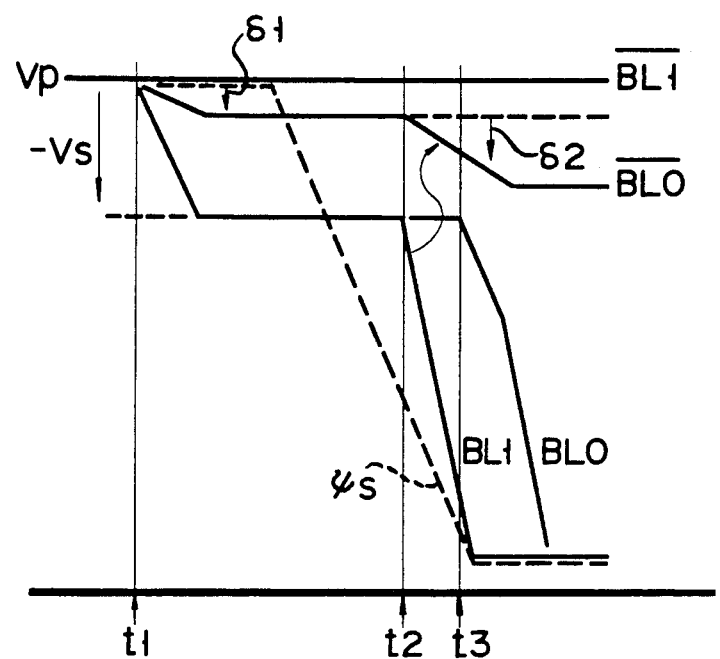
FIG. 2 is a diagram showing potential variation on each of two bit lines constituting a single bit line pair in the DRAM.

Before explaining embodiments of the present invention, a description is first given of how interference noise is produced within a MOS type dynamic random access memory (DRAM) of the prior art with reference to FIGS. 1 and 2 in order to facilitate the understanding of the main concept of the invention. The DRAM disclosed in FIG. 1 is a memory device of a folded bit line arrangement having dynamic type sense amplifier circuits.

As shown in FIG. 1, a pair of data transfer lines, hereafter sometimes called a "pair of bit lines" or "a bit line pair" BL0, $\overline{BL0}$ are connected to a dynamic type sense amplifier SA0 having two metal oxide semiconductor (MOS) transistors Q1 and Q2. Similarly, another pair of bit line BL1, $\overline{BL1}$ are connected to a dynamic type sense amplifier SA1 having two metal oxide semiconductor (MOS) transistors Q3 and Q4. Memory cells are provided at points of intersection (cross points) between these bit line pairs and a word line WL. Each of the memory cells is constituted by a single MOS transistor and a single MOS capacitor arranged in a known manner. In such an arrangement, a coupling capacitance between two neighboring bit lines $\overline{BL0}$ and BL1 is designated by "Cm."

When the DRAM gets active, the word line WL is selected so that signal voltages -Vs are read onto bit lines BL0, BL1, respectively. The word line WL is rendered ON at time t1. At this time, the bit line $\overline{BL0}$ for supplying the corresponding sense amplifier with a reference voltage receives interference noise $-\delta 1$ which is applied from the neighboring bit line BL1 via the coupling capacitance Cm. The noise impression shows bad behavior towards the voltage potential on the bit line $\overline{BL0}$, which is thus decreased. As a result, the gate voltage of a sense amplifier transistor Q1, which is connected at the gate electrode thereof with the bit line $\overline{BL0}$, is decreased.

When an activation signal $\Psi s$ is changed to have the low level, as shown by a dotted line in FIG. 2, the following phenomenon will occur. At time t2, the transistor Q3 which exhibits the highest gate-to-source voltage among the sense amplifier transistors Q1 to Q4, is rendered conductive. The voltage potential on the bit line BL1 is decreased gradually. Under such a condition, the transistor Q1 is decreased in its gate voltage due to the impression of the interference noise $-\delta 1$, so that the turn-on timing of this transistor will be delayed. The transistor Q1 will be first rendered conductive at time t3. Therefore, during the interval between time t2 and time t3, the bit line $\overline{BL0}$ is still maintaining the "high impedance" condition. This bit line $\overline{BL0}$ is thus being continuously supplied with interference noise $\delta 2$ via the coupling capacitance Cm. The secondary noise impression behaves also to lower the voltage on the bit line $\overline{BL0}$. Such a condition will be maintained before the sense amplifier activation signal $\Psi s$ is fully decreased to have the lowest level. As a result, the secondary noise component $\delta 2$ is superimposed to the initial noise component $\delta 1$; for this reason, the voltage on the bit line $\overline{BL0}$ is extremely decreased by the sum of the noise components, that is, $\delta 1 + \delta 2$, as shown in FIG. 2.

The noise interference between the neighboring bit lines reduces the data read rate of the DRAM, and also degrades the operation reliability thereof, for the following reason. The time required for cell data amplification, i.e., the necessary sensing time is increased undesirably. In the worst case, if the potential difference between a read data voltage and a corresponding dummy cell voltage to be input to the sense amplifier is lower than the minimum level of voltage that can be sensed by the sense amplifier, accidental malfunction will happen that the sense amplifier latches the memory cell data input thereto. As the integration density of the DRAM is increased, the coupling capacitance Cm between neighboring pairs of bit lines is also increased; the aforementioned "interference noise" problem will be more severe.

The "interference noise" problem may be solved significantly by embodiments in accordance with the present invention, which will be presented below.

Figure 8:
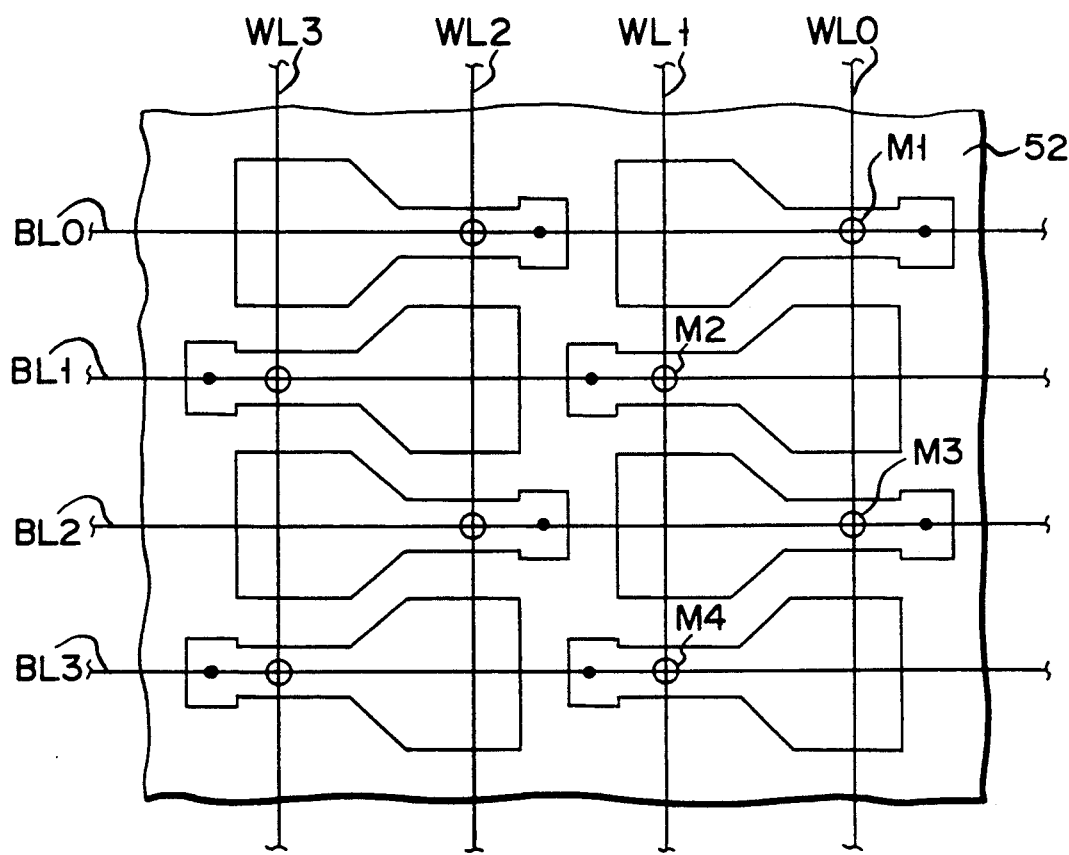
FIG. 8 is a simplified plan views of the memory cell layout on a chip substrate of the DRAM shown in FIG. 7.

Referring now to FIG. 3, a MOS type DRAM having a folded bit line structure in accordance with one preferred embodiment of the present invention is generally designated by reference numeral "10." A plurality of pairs of parallel bit lines BL0, $\overline{BL0}$, BL1, $\overline{BL1}$, ..., BLn, $\overline{BLn}$ are provided on a chip substrate (is not shown in FIG. 3: see FIG. 8 or 9). Dynamic type sense amplifiers SA1, SA2, ..., SAn are provided connected to these bit line pairs at certain end portions thereof, thereby to constitute the "folded" type bit line arrangement. A circuit 12 for driving these sense amplifiers is connected to common sources of the sense amplifiers SA. This sense amplifier driver 12 supplies the sense amplifiers with an activation signal $\Psi s$.

A selected number of memory cell word lines WL and a dummy cell word line DWL are provided so that they insulatively intersect the bit line pairs BL, $\overline{BL}$. In FIG. 3, only a memory cell word line is given for illustrative purposes only. The memory cell word lines will be simply referred to as "word lines" hereinafter.

Memory cells M1, M2, ..., Mn are provided at points of intersection (cross points) between the word line WL and bit lines BL0, BL1, ..., BLn. Each of these memory cells has a single MOS transistor and a single MOS capacitor. Dummy cells DM1, DM2, ..., DMn are provided at cross points between the dummy cell word line DWL and bit lines $\overline{BL0}, \overline{BL1}, \ldots, \overline{BLn}$, in the same manner as in the memory cells. Each of these dummy cells has also a single MOS transistor and a single MOS capacitor. Reference numeral "Vp" is used to designate a plate voltage to be supplied to the memory cells and dummy cells.

A row decoder circuit 14 is connected to the word line WL via a circuit 16 for driving the word line WL, which will be referred to as a "word line driver" hereinafter. The row decoder 14 is also connected to the dummy word line DWL via a circuit 18 for driving the dummy word line DWL, which will be referred to as a "dummy word line driver" hereinafter.

The bit line pairs BL, $\overline{BL}$ are provided with equalizer circuits EQi (i=1, 2, ..., n), each of which functions to precharge the corresponding pair of bit lines so that these bit lines have the same voltage. Now let's consider about one bit line BL0, $\overline{BL0}$. As shown in FIG. 3, the equalizer EQ1 is formed of two precharging MOS transistors Q7 and Q8 and a short-circuiting MOS transistor Q9. The precharging transistors Q7 and Q8 are connected at their drains to a circuit 20 for generating a bit line precharge voltage Vpc (the circuit 20 will be referred to as "precharge voltage generator" hereinafter). The transistors Q7 and Q8 are connected at the sources thereof to the bit line BL0, $\overline{BL0}$. The short-circuiting transistor Q9 is connected at the source and drain thereof with the bit line pair BL0, $\overline{BL0}$. The configuration of the equalizers EQ provided for the remaining bit line pairs is substantially same as in the above equalizer EQ.

The equalizers EQ are featured in that the aforementioned three transistors constituting each equalizer EQi are not connected in common at the gate electrodes thereof and that these gate electrodes of the three transistors are electrically independent of one another. In the equalizer EQ1, the gate electrodes of the precharging transistors Q7 and Q8 are connected respectively to independent inputs of an equalize signal generating circuit 22; the gate electrode of the short-circuiting transistor Q9 is connected to an output of an AND gate 24, which has inputs connected to the independent inputs of the equalize signal generator 22. These transistors Q7, Q8 and Q9 may be gate-controlled independently by the equalize signal generator 22 and the AND gate 24.

More specifically, in an active mode of the present DRAM 10, the equalize signal generator 22 generates two equalize signals $\overline{EQL0}, \overline{EQL1}$, which are phase-shifted (or shifted in signal generation timing) by time $\tau$ from each other as shown in FIG. 4. The equalize signal $\overline{EQL0}$ is supplied to the gate electrode of the precharging transistor Q7 of the equalizer EQ1 and also to the gate electrodes of the corresponding precharging transistors Q10 and Q13 of the remaining equalizers EQ2, ..., EQn. The equalize signal $\overline{EQL1}$ is supplied to the gate electrode of the other precharging transistor Q8 of the equalizer EQ1 and also to the gate electrodes of the corresponding precharging transistors Q11 and Q14 of the remaining equalizers EQ2, ..., EQn. An output signal $\overline{EQL01}$ of the AND gate 24, which represents the logical multiplication of the equalize signals $\overline{EQL0}$ and $\overline{EQL1}$, is supplied to the gate electrode of the bit line short-circuiting transistor Q9 of the equalizer EQ1 and those of the corresponding transistors Q12, Q15 of the remaining equalizers EQ2, ..., EQn.

As shown in FIG. 4, the DRAM enters in a read cycle when an externally supplied control signal $\overline{RAS}$ is changed to have the logical "L" level at time t0 in a data read mode of the DRAM. Row decoder 14 selects one word line WL in accordance with the row address thus designated. At this time, the dummy word line DWL is also selected. Under such a condition, in the equalize signal generator 22, one ($\overline{EQL0}$) of the two output signals thereof is first changed to have the "L" level at time t1. In responding to the signal level change, the level of an output signal $\overline{EQL01}$ of the AND gate 24 is changed simultaneously to the "L" level. One of the precharging transistors of each of the equalizers EQ1, EQ2, ..., EQn is rendered nonconductive in response to the equalize signal $\overline{EQL0}$. This transistor is one of the specific transistors Q7, Q10, Q13, which are connected to the bit lines BL0, BL1, ..., BLn onto which the memory cell data is actually read out. In response to the equalize signal $\overline{EQL01}$, the short-circuiting transistors Q9, Q12, Q15 of the equalizers EQ1, EQ2, ..., EQn are simultaneously rendered nonconductive. It should be noted that the other precharging transistors Q8, Q11, Q14 connected to the bit lines $\overline{BL0}, \overline{BL1}, \ldots$, onto each of which dummy cell data is read from the corresponding dummy cell DMi, are still kept conductive (ON-state) at the time t1. This means that, in the time t1, the first bit lines BL0, BL1, ..., BLn on which the memory cell data appears are set in the "high-impedance" state; whereas, the second bit lines $\overline{BL0}, \overline{BL1}, \ldots, \overline{BLn}$, onto which the dummy cell data is read, are maintained in the "low-impedance" state. At this time, the voltage on these bit lines $\overline{BL0}, \overline{BL1}, \ldots \overline{BLn}$ are forcedly fixed to the output voltage of the precharge voltage generator 20, i.e., the precharge voltage Vpc.

After a predetermined time $\tau$ has passed from the time t1, i.e., at time t2, the other output signal $\overline{EQL1}$ of equalize signal generator 22 changes to have the "L" level. The other precharging transistors Q8, Q11, Q14 are then rendered nonconductive in response to the signal level change. At this time, all the transistors of each equalizer EQi are set in the OFF state.

Thereafter, when the activation signal $\Psi s$ generated by the sense amplifier driver 12 changes to have the "L" level, a sense-amplification operation is performed with respect to a data signal which is read from a selected memory cell, for example, the memory cell M1 which is provided in the bit line BL0.

According to the embodiment, in the data read mode, the dummy cell bit lines $\overline{BL0}, \overline{BL1}, \ldots, \overline{BLn}$ are continuously set in the low-impedance state, and forced to hold thereon the precharge voltage Vpc during a selected period corresponding to the phase-shift period $\tau$ (the interval between time points t1 and t2) of the two output signals $\overline{EQL0}$ and $\overline{EQL1}$ of the equalize signal generator 22, whereby any interference noise can be absorbed which is produced and introduced from the aforementioned neighboring bit lines BL1, BL2, ....

The experiment conducted by the present inventors has demonstrated that, when the data of the selected memory cell M1 is read out, the voltage appearing on the corresponding bit line $\overline{BL0}$ was free from influence of the interference noise introduced from the neighboring bit line BL1, and could be substantially constant as shown by a solid line 26 in FIG. 4. In contrast, in a prior art DRAM, the corresponding voltage on the same bit line in a data read mode was extremely varied as shown by a dotted line 28 in FIG. 4.

It should be noted, in this case, that a delay $\tau$ exists in an operation time interval between the start of driving the word line WL and the start of activation of the sense amplifiers SA, and that such a delay time may damage the high-speed data read operation of the DRAM. However, in the actual data read operation in the DRAM, inherent time delay must exist naturally: the actual appearance of the cell data on a bit line should be delayed by a certain time from the selection of a word line. Therefore, if the delay time $\tau$ is set at a specific value which is within the inherent delay time length, it will never happen that the delay time $\tau$ does great damage to the high-speed data read operation of the DRAM. It may be assumed that a time constant determining the delay time is substantially same as that of carrier discharge due to the interference noise introduced into the sense amplifiers SA. For this reason, the time $\tau$ can be set to a desired value within a specific range by which value the data reading speed of the DRAM is not influenced; the interference noise can thus be compensated for without damaging the data reading rate of the DRAM.

FIG. 5 shows a DRAM 30 in accordance with another embodiment of the present invention, wherein the same reference marks are used to designate the same components as in the aforementioned embodiment shown in FIG. 3, and a detailed explanation therefor will be omitted. The DRAM 30 presented here uses a different dummy cell system, according to which the dummy cell capacitance is set equal to the memory cell capacitance, the dummy cell write voltage is half the power supply voltage Vcc of the DRAM, i.e., Vcc/2, and, in the precharge mode, the voltage is written in the dummy cell via an extra MOS transistor provided to be used only for the dummy cell write operation.

As shown in FIG. 5, common transistor-capacitor nodes of dummy cells DM1, DM2, . . . , DMn are connected to dummy cell write transistors Q15, Q16, Q17. These transistors Q15, Q16, Q17 are connected at their drains to a circuit 32 for generating a dummy cell voltage Vdc. The transistors Q15, Q16, Q17 are connected at the gate electrodes thereof to a circuit 34 for producing a dummy cell write signal DCW.

FIG. 6 shows a timing chart of some voltage signals generated in a data read mode of the DRAM. First of all, an external control signal $\overline{RAS}$ is level-changed, and a row address is taken within the DRAM in the same manner as in the previous embodiment. A word line WL selected by the row decoder 14 and a dummy word line DWL are designated in accordance with the row address. At this time, the gate input signal DCW for controlling the dummy cell write transistors Q15, Q16, Q17 are held and maintained at the logical "H" level up to time t2. Therefore, during time period $\tau$ (=t2−t1), bit lines $\overline{BL0}$, $\overline{BL1}$, . . . , $\overline{BLn}$ onto which dummy cell data is read out are short-circuited with the dummy cell voltage generator 32 by switching transistors and the write transistors Q15, Q16, Q17 of the dummy cells DM1, DM2, . . . , so that these bit lines are set and held in the low-impedance condition. After the time t2, the sense amplifiers SA1, SA2, . . . are activated for the first time to execute signal amplification. With such an arrangement, the interference noise due to the coupling capacitance between neighboring bit lines can also be eliminated without damaging the data reading speed of the DRAM. As being apparent from the above explanation, a circuit arrangement may be variously modified which eliminates the interference noise by maintaining a dummy cell side bit line in the low-impedance condition in a predetermined time interval in the data read mode. With use of any one of the modified circuit arrangements, it is possible to remove the interference noise produced due to the coupling capacitance between neighboring bit lines in the highly integrated DRAM of the folded type bit line structure; therefore, a DRAM capable of high-speed operation with improved operation margin can be provided.

Turning now to FIG. 7, a DRAM in accordance with still another embodiment of the present invention is generally designated by reference numeral "50." The DRAM 50 has an "open bit line" type memory cell layout. In each pair of bit lines, a memory cell bit line BLi (i=1, 2, . . . , n) and a dummy cell bit line $\overline{BLi}$ are aligned linearly along a straight line. The open bit line pairs are parallel with one another as shown in FIG. 7. These bit line pairs are supplied with a precharge voltage Vpc as needed. Sense amplifiers SA0, SA1, SA2, SA3, . . . , SAn are arranged so that they are alternately shifted in position. The sense amplifiers SA0, SA2, SA4, . . . of the 0-th bit line pair BL0, $\overline{BL0}$ and the second, fourth, . . . (even-numbered) bit line pairs BL2, $\overline{BL2}$, BL4, $\overline{BL4}$, . . . are linearly aligned in a positioning line perpendicular to the parallel bit line pairs. The remaining sense amplifiers SA1, SA3, . . . of the first, third, . . . (odd-numbered) bit line pairs BL1, $\overline{BL1}$, BL3, $\overline{BL3}$, . . . are linearly aligned along another positioning line perpendicular to these parallel bit line pairs and parallel with the above positioning line, thereby to provide a "zig-zag" configuration of the sense amplifiers SA0, SA1, SA2, SA3, . . . , SAn. The first group of sense amplifiers SA0, SA2, SA4, . . . are simultaneously activation-controlled in response to a first activation signal $\Psi s0$, whereas the second group of sense amplifiers SA1, SA3, . . . are simultaneously activation-controlled in response to a second activation signal $\Psi s1$. Since the second activation signal $\Psi s1$ is different in phase from the first activation signal $\Psi s0$, it will never happen that the first and second groups of sense amplifiers are both activated at once.

Parallel word lines WL0, WL1, . . . , WLm extend perpendicularly to the bit lines BL0, BL1, . . . , BLn; memory cells M1, M2, . . . are provided at cross points therebetween, as shown in FIG. 7. Parallel dummy word lines DWL0 and DWL1 are perpendicular to the bit lines $\overline{BL0}$, $\overline{BL1}$, . . . , $\overline{BLn}$; dummy memory cells DM1, DM2, . . . are provided at cross points therebetween, as illustrated in this drawing.

It should be noted that the memory cells M and the dummy cells DM are not provided at all the cross points between the bit lines and the word lines. The memory cells M are provided only at alternate cross points selected out of the matrix arrangement of cross points. For example, with respect to the 0-th bit line BL0, memory cells are provided only at the cross points between this bit line and selected word lines consisting of 0-th word line WL0 and even-numbered word lines WL2, WL4, . . . ; no memory cells exist at the cross points between this bit line BL0 and the odd-numbered word line WL1, WL3, . . . . Similarly, in the first bit line BL1, memory cells are provided only at the cross points between this bit line and selected odd-numbered word lines WL1, WL3, . . . ; no memory cells exist at the cross points between this bit line BL1 and the even-numbered word line WL2, WL4, . . . . The same arrangement may be applied to the dummy cells, which are alternately provided in the two arrays of cross points. For example, with respect to the dummy word line DWL0, dummy cells are provided only at the cross points between this word line and selected dummy bit lines consisting of the 0-th dummy bit line $\overline{BL0}$ and the even-numbered dummy bit lines $\overline{BL2}$, . . . . Also, in the dummy word line DWL1, dummy cells are provided only at the cross points between this word line and the even-numbered dummy bit lines $\overline{BL1}$, $\overline{BL3}$, . . . . The actual plan layout of these memory cells M are presented in FIG. 8 or FIG. 9, wherein reference numeral "52" is used to designate a chip substrate of the DRAM.

The interference noise elimination operation will now explained, with reference to FIG. 10, in a data read mode of the DRAM 50 thus arranged as described above. The DRAM 50 enters in the data read cycle, when the external control signal RAS is changed to have the "L" level at time t0 in the same manner as in the above presented DRAMs 10 and 30. When a row address is taken inside the DRAM 50, a row decoder (not shown in FIG. 7) selects a word line WLi in accordance with the address thus designated. At this time, the corresponding dummy word line DWLi is also designated. For example, when a memory cell M3 is subjected to the data read operation, the word line WL0 and the dummy word line DWL0 are selected. The voltage potential on these word lines WL0 and DWL0 is changed at time t1 from the "L" level to the "H" level, as shown in FIG. 10. As a result, the signal carriers of the selected memory cell M3 are read on the corresponding bit line BL2; the signal carriers of the dummy cell DM3 are read onto the dummy bit line $\overline{BL2}$.

Thereafter, at time t2, the activation signal $\Psi s0$ for the first group of sense amplifiers SA0, SA2, SA4, . . . changes to have the "L" level. In response to this signal level change, the sense amplifier SA2 in the selected bit line pair BL2, $\overline{BL2}$ are activated together with the remaining sense amplifiers of this group. A read voltage appearing on the selected bit line pair BL2, $\overline{BL2}$ is then amplified by the sense amplifier SA2.

Attention should be paid to the fact that the second group of sense amplifiers SA1, SA3, . . . are kept inactivated or inoperative during the first group of sense amplifiers SA0, SA2, SA4, . . . including the sense amplifier SA2 for amplifying the read voltage of the selected memory cell M3 are being activated, since, when the activation signal $\Psi s0$ changes at the "L" level, the other activation signal $\Psi s1$ is continuously kept at the "H" level as shown in FIG. 10. Therefore, when the memory cell M3 is being subjected to the data reading in the selected bit line pair BL2, $\overline{BL2}$, two bit line pairs neighboring on the selected bit line pair BL2, $\overline{BL2}$ at the both sides thereof, that is, the bit line pair BL1, $\overline{BL1}$ and the bit line pair BL3, $\overline{BL3}$, are being fixed to the precharge voltage Vpc as shown in FIG. 10. Such a condition may equal a specific condition that the selected bit line pair BL2, $\overline{BL2}$ on which the data read is being executed is electrically isolated or shielded by the two neighboring bit line pairs BL1, $\overline{BL1}$, BL3, $\overline{BL3}$. Such an electrical isolation enables to suppress or prevent any interference noise from being impressed onto the selected bit line pair BL2, $\overline{BL2}$ which is being subjected to the memory cell data reading.

The internal circuit configuration of the DRAM 50 may be modified as shown in FIG. 11. According to a DRAM 60 illustrated in FIG. 11, the both end portions of open-type bit line pairs BL are connected to the precharge voltage Vpc via switching transistors T.

More specifically, the first group of bit lines consisting of the 0-th bit line BL0 and the even-numbered bit lines BL2, . . . are connected to the precharge voltage Vpc via switching transistors T0, T2, . . . . These transistors are supplied with a control signal $\Psi pre0$ at the gate electrodes thereof, and execute a switching operation in response to the signal $\Psi pre0$. On the other hand, the second group of bit lines consisting of the odd-numbered bit lines BL1, BL3, . . . are connected to the precharge voltage Vpc via switching transistors T1, T3, . . . . These transistors are supplied with another control signal $\Psi pre1$ at the gate electrodes thereof, and perform a switching operation in response to the signal signal $\Psi pre1$. The first group of bit lines consisting of the 0-th bit line $\overline{BL0}$ and the even-numbered bit lines $\overline{BL2}$, . . . are connected to the precharge voltage Vpc via switching transistors DT0, DT2, . . . . These transistors DT0, DT2, . . . are supplied with the control signal $\Psi pre0$ at the gate electrodes thereof, and carries out a switching operation in response to this signal $\Psi pre0$. The second group of bit lines consisting of the odd-numbered bit lines $\overline{BL1}$, $\overline{BL3}$, . . . are connected to the precharge voltage Vpc via switching transistors DT1, DT3, . . . . These transistors are supplied with the control signal $\Psi pre1$ at the gate electrodes thereof, and execute a switching operation in response to the signal $\Psi pre1$.

When the memory cell M3 is selected and subjected to the data reading, after the data read cycle get started at time t0, the switching control signal $\Psi pre0$ is changed at time t1 to have the "L" level instead of the "H" level before the voltage potential on the selected bit lines WL0 and DWL0 is dropped from the "H" level to the "L" level at time t2, as shown in FIG. 12. The transistors T0, T2, . . . and the transistors DT0, DT2, . . . are thus rendered nonconductive simultaneously, so that the selected bit lines BL2, $\overline{BL2}$ are electrically disconnected from the precharge voltage Vpc. Under such a condition, the other switching control signal $\Psi pre1$ has continuously the same "H" level. Therefore, the remaining transistors T1, T3, . . . , and DT1, DT3, . . . are kept conductive, whereby the electrical connection is maintained between the precharge voltage Vpc and the bit lines BL1, $\overline{BL1}$, BL3, $\overline{BL3}$ neighboring upon the selected bit lines BL2, $\overline{BL2}$ at the both sides thereof. The following operation is same as in the previous embodiment shown in FIG. 7: when the activation signal $\Psi s0$ is changed at the "L" level at time t3, the other activation signal $\Psi s1$ is maintained at the "H" level, and the same data sensing operation will be performed.

With such an arrangement, when the memory cell M3 is being subjected to the data reading in the selected bit line pair BL2, $\overline{BL2}$, this bit line pair is successfully separated from the remaining circuit components of the electrical internal configuration of the DRAM 60 to provide a so-called "electrically floating" condition wherein the precharge voltage Vpc is maintained on the selected bit line pair BL2, $\overline{BL2}$. In other words, it can be expressed that the selected bit line pair BL2, $\overline{BL2}$ maintains thereon the precharge voltage Vpc in the "high-impedance" condition. On the other hand, the two bit line pairs BL1, $\overline{BL1}$, BL3, $\overline{BL3}$ neighboring on the selected bit line pair BL2, $\overline{BL2}$ maintains thereon the precharge voltage Vpc in the "low-impedance" condition, since these bit line pairs are allowed to be continuously connected to the precharge voltage Vpc. As a result, the selected bit line pair BL2, $\overline{BL2}$ can be effectively shielded by the neighboring bit line pairs BL1, $\overline{BL1}$, BL3, $\overline{BL3}$ positioned at the both sides of the selected bit line pair. This electrical shielding may lead to superior suppression or elimination of the interference noise to be introduced onto the selected bit line pair BL2, $\overline{BL2}$.

Figure 13:
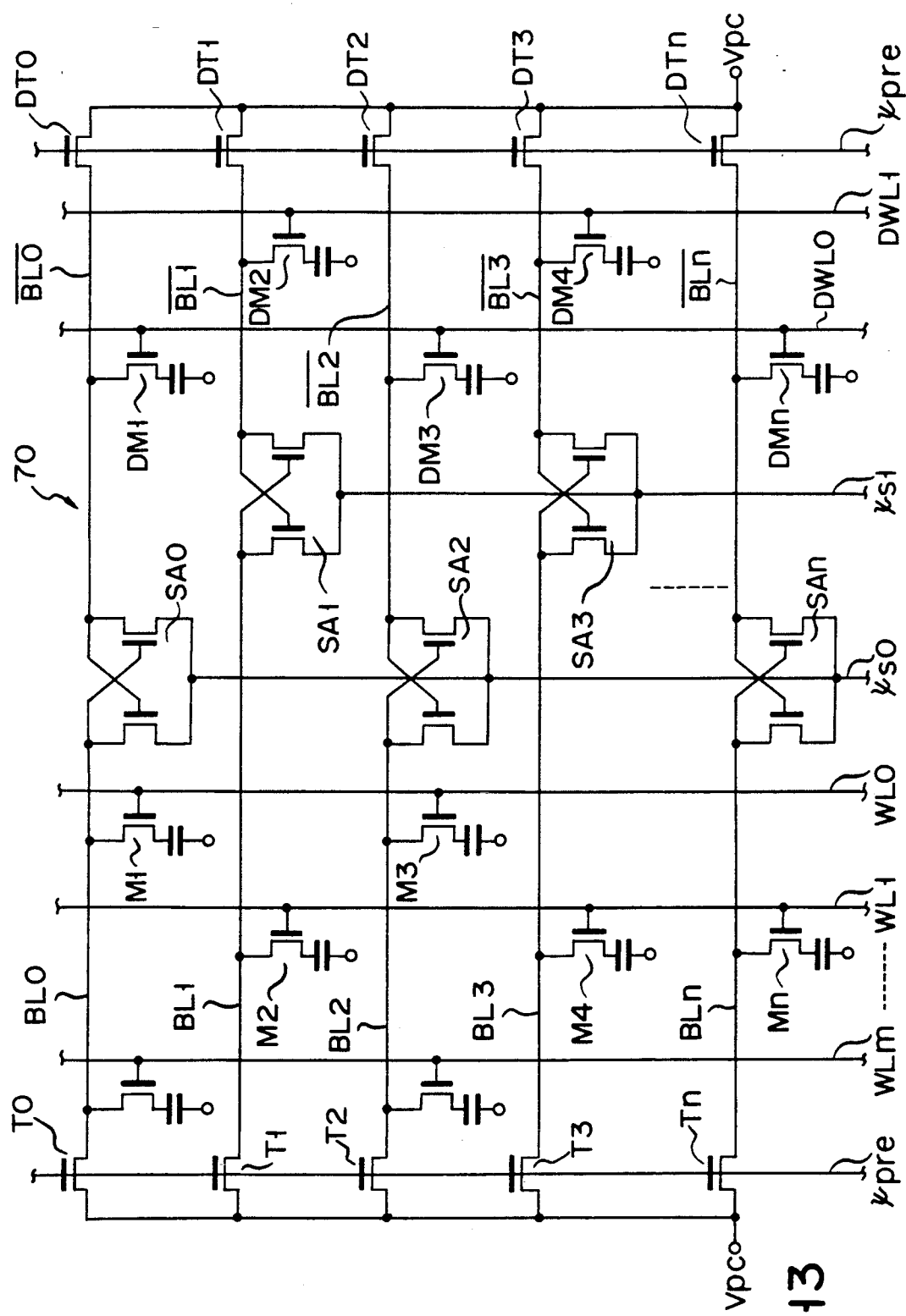
FIG. 13 is a schematic diagram of the main part of the internal circuit arrangement of an open bit line type DRAM which is another modification of the embodiment of the present invention shown in FIG. 7.

The internal circuit configuration of the DRAM 50 of FIG. 7 may also be modified as shown in FIG. 13. In a DRAM 70 presented here in FIG. 11, all the bit line BL0, BL1, BL2, BL3, . . . , BLn are connected to the precharge voltage Vpc via an array of switching transistors T0, T1, T2, T3, . . . , Tn; whereas, all the bit line $\overline{BL0}$, $\overline{BL1}$, $\overline{BL2}$, $\overline{BL3}$, . . . , $\overline{BLn}$ are connected to the same precharge voltage Vpc via another array of switching transistors DT0, DT1, DT2, DT3, . . . , DTn. These transistors T and DT are supplied with a switching control signal Ψpre at the gate electrodes thereof. The waveform of the signal Ψpre is same as that of the switching control signal Ψpre0 shown in FIG. 12. Therefore, when the switching control signal Ψpre is changed at the "H" level at time t1, which is before the time t2 at which the activation signal Ψs0 changes in voltage level, all the open-type bit lines BL, $\overline{BL}$ containing the selected pair of bit lines BL2, $\overline{BL2}$ are disconnected simultaneously from the precharge voltage Vpc. This means that, when a data sense-amplification operation is being executed in the selected bit line pair BL2, $\overline{BL2}$, the two neighboring bit line pairs BL1, $\overline{BL1}$, BL3, $\overline{BL3}$ maintains thereon the precharge voltage "impedance" state). With such an arrangement, the interference noise can be suppressed or prevented from being impressed onto the selected bit line pair BL2, $\overline{BL2}$.

Figure 15:
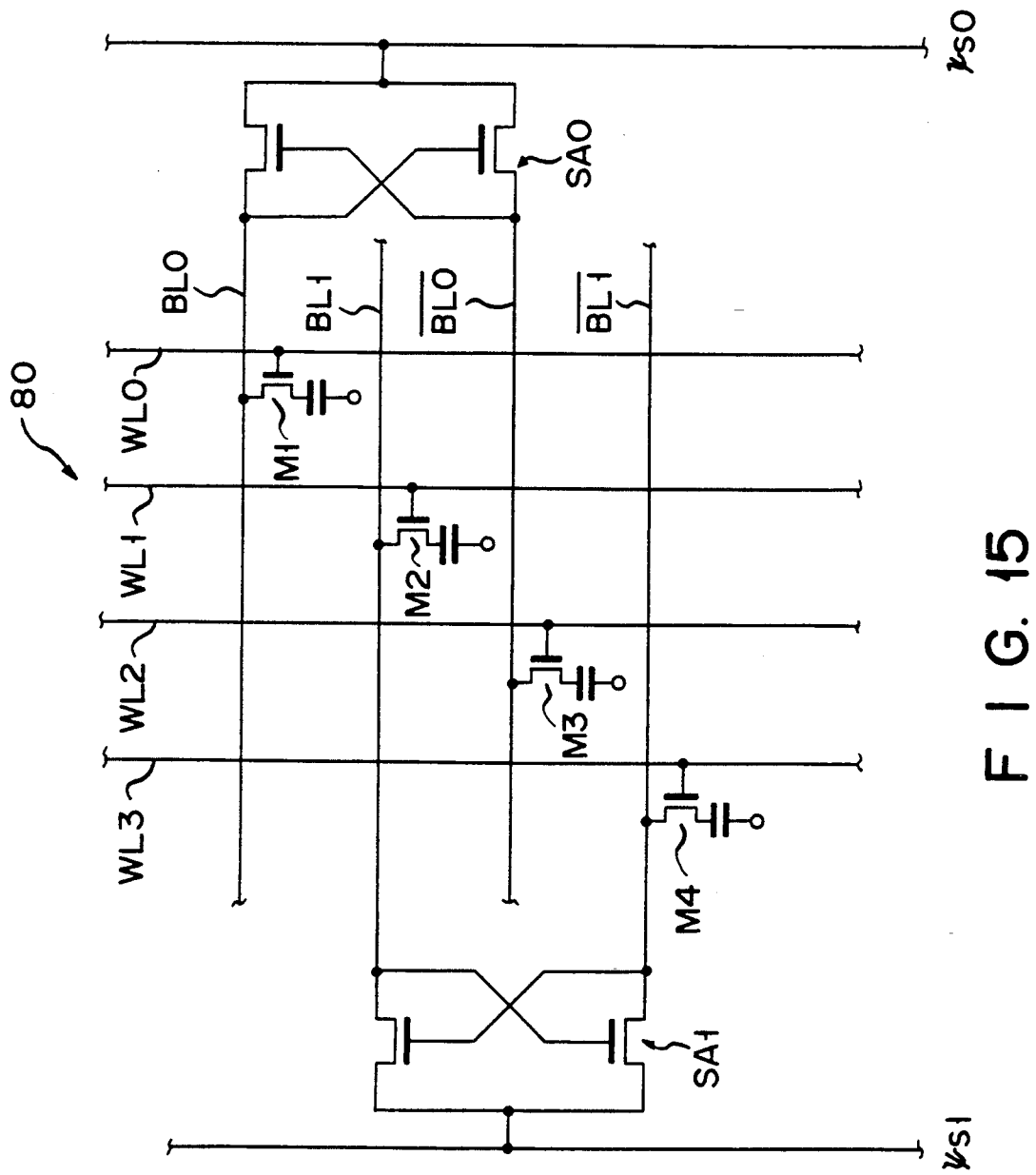
FIG. 15 is a schematic diagram of the main part of the internal circuit arrangement of a folded type DRAM in accordance with a further embodiment of the present invention.

Referring now to FIG. 15, a "folded-bit line" type DRAM in accordance with the fourth embodiment of the present invention is designated generally by reference numeral "80." A pair of bit lines BLi, $\overline{BLi}$ are folded at one end portion thereof so that these bit lines are parallel with each other. This pair of parallel bit lines BL0, $\overline{BL0}$ are connected at the end portion thereof to a dynamic sense amplifier SA0, which is responsive to an activation signal Ψs0 A neighboring bit line pair has a bit line BL1 which is positioned between the above bit lines BL0, $\overline{BL0}$. These neighboring folded bit lines BL1, $\overline{BL1}$ puts the bit line $\overline{BL0}$ therebetween as shown in FIG. 15. A sense amplifier SA1 is connected to one end portions of the neighboring bit lines BL1, $\overline{BL1}$, which is opposite to the position of the sense amplifier SA0. The sense amplifier SA1 operates in response to a activation signal Ψs1. Parallel word lines WL0, WL1, WL2, WL3, . . . run perpendicular to the folded bit lines BL, $\overline{BL}$. Memory cells M1, M2, M3, M4, . . . are provided at cross points between the bit lines BL, $\overline{BL}$ and the word lines W1 in a manner as shown in FIG. 15.

In the DRAM 80, when a certain memory cell, for example memory cell M2, is selected for data reading, the sense amplifier SA1 of a selected bit line pair BL1, $\overline{BL1}$ becomes operative in responding to the level change from the "H" level to the "L" level in the activation signal Ψs1, and the sensing operation gets started. At this time, the other sense amplifier SA0 connected to non-selected bit line pair BL0, $\overline{BL0}$ is kept inoperative, since the activation signal Ψs0 maintains the "H" level. With such an arrangement, the voltage potential on the non-selected folded bit lines BL0, $\overline{BL0}$, which face each other with the selected bit line BL1 therebetween, is held continuously to the precharge voltage Vpc. It is thus possible to suppress or prevent any interference noise from being supplied from the neighboring bit lines BL0, $\overline{BL0}$ to the selected bit line pair BL1, $\overline{BL1}$, on which the data sensing operation of read data is being performed.

Figure 16:
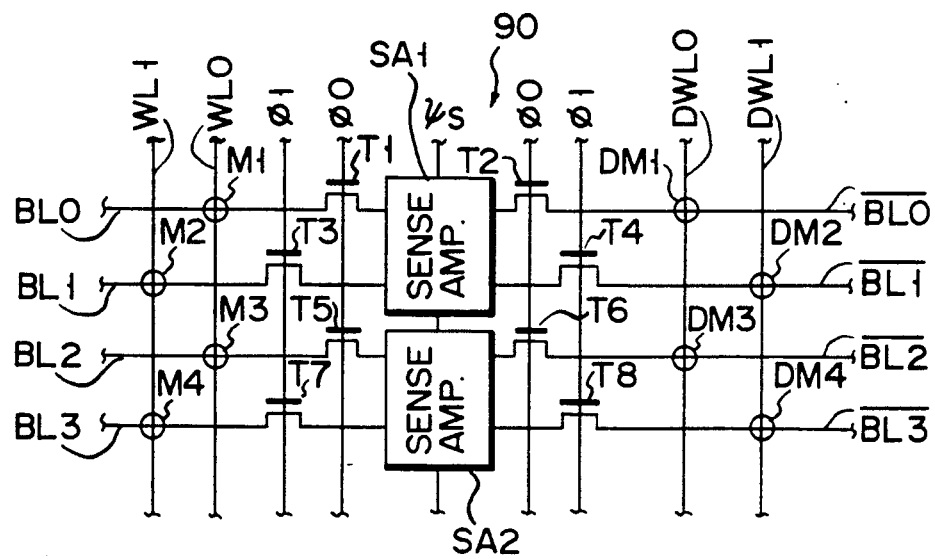
FIG. 16 is a schematic diagram of the main part of the internal circuit arrangement of a modified folded type DRAM in accordance with a still further embodiment of the present invention.

Referring to FIG. 16, there is shown a modified "open-bit line" type DRAM in accordance with the fifth embodiment of the present invention, which is designated generally by reference numeral "90." The positioning arrangement of memory cells provided at cross points between bit lines BL, $\overline{BL}$ and word lines WL in the DRAM 90 is essentially same as that of the DRAMs shown in FIGS. 7, 11 and 13. The DRAM 90 is characterized in that a sense amplifier SAi (i = 1, 2, . . . ) is provided in common for two neighboring open type bit line pairs. As shown in FIG. 16, a sense amplifier SA1 is provided in common with respect to a bit line pair BL0, $\overline{BL0}$ and a bit line pair BL1, $\overline{BL1}$. Similarly, a sense amplifier SA2 is provided in common with respect to a bit line pair BL2, $\overline{BL2}$ and a bit line pair BL3, $\overline{BL3}$.

It should be noted that a gate circuit is provided which allows the common sense amplifier SA1 to be selectively connected to one of the two bit line pairs connected together with the common sense amplifier SA1. This gate circuit includes switching transistors T1, T2, . . . , T8 shown in FIG. 16. More specifically, the bit lines BL0, $\overline{BL0}$ are connected to the sense amplifier SA1 via switching transistors T1 and T2, respectively; the bit lines BL1, $\overline{BL1}$ are connected to the same sense amplifier SA1 via switching transistors T3 and T4, respectively. Similarly, the bit lines BL2, $\overline{BL2}$ are connected to the sense amplifier SA2 via switching transistors T5 and T6, respectively; the bit lines BL3, $\overline{BL3}$ are connected to the same sense amplifier SA2 via switching transistors T7 and T8, respectively. These transistors T1, T2, T5, T6 are supplied with a switching control signal $\phi 0$ at the gate electrodes thereof, and perform a switching operation in response to this signal. The remaining transistors T3, T4, T7, T8 are supplied with a different switching control signal $\phi 1$ at the gate electrodes thereof, in response to which these transistors perform a switching operation simultaneously. With respect to the sense amplifier SA1, the transistors T1 and T2 and the transistors T3 and T4 are alternately rendered conductive. Therefore, the bit line pair BL0, $\overline{BL0}$ and the bit line pairs BL1, $\overline{BL1}$ neighboring thereto are allowed to be alternately connected to the sense amplifier SA1.

Figure 17:
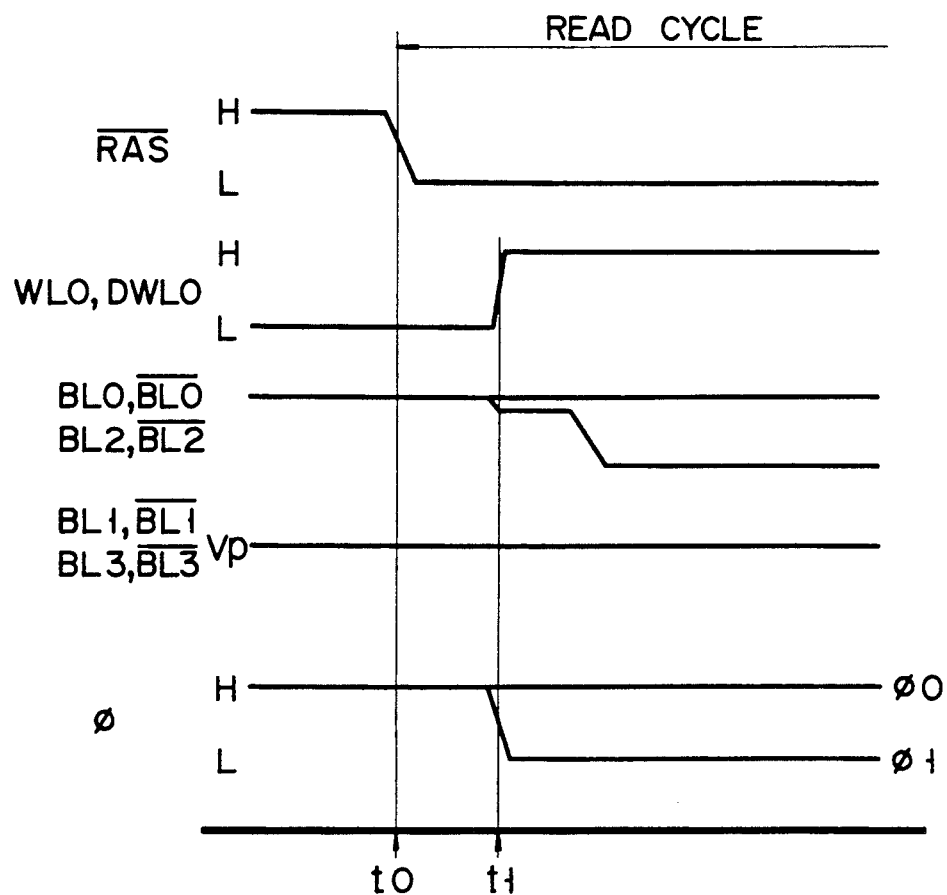
FIG. 17 is a diagram showing waveforms of the main voltage signals generated at the main portions of the DRAM shown in FIG. 16 during a sense operation in a data read mode thereof.

A read cycle is set in the DRAM 90 when an externally supplied control signal RAS is changed to have the "L" level at time t1, as shown in FIG. 17. For example, a word line WL0 and a dummy word line DWL0 are selected; the voltage potential on these word lines are changed from the "L" level to the "H" level. The storage data are now read onto the bit lines BL0, BL2, . . . and the dummy bit lines $\overline{BL0}$, $\overline{BL2}$, . . . , respectively. At this time, the control signal $\phi 1$ is changed to have the "L" level instead of the "H" level. The control signal $\phi 0$ maintains the "H" level. Therefore, only the selected bit line pairs BL0, $\overline{BL0}$, BL2, $\overline{BL2}$, . . . are allowed to be connected to the sense amplifiers SA1, SA2, . . . ; the remaining non-selected bit line pairs BL1, $\overline{BL1}$, BL3, $\overline{BL3}$, . . . are electrically disconnected from these sense amplifiers SA1, SA2, . . . . This means that, during a sensing operation is being executed with respect to the selected bit lines pairs BL0, $\overline{BL0}$, BL2, $\overline{BL2}$, . . . , the non-selected bit line pairs BL1, $\overline{BL1}$, BL3, $\overline{BL3}$, . . . are forcedly set in the "electrically floating" condition and maintain the precharge voltage Vpc as shown in FIG. 17, whereby any interference noise can be suppressed or prevented from being impressed from the non-selected bit line pairs onto the selected bit line pairs due to the coupling capacitance therebetween.

What is claimed is:

1. A dynamic random access memory comprising:
   (a) a plurality of pairs of folded bit lines sequentially aligned and respectively including first bit lines and second bit lines which form bit line pairs;
   (b) first and second word lines insulatively intersecting said plurality of pairs of folded bit lines at intersecting points therebetween;
   (c) memory cells arranged at the intersecting points between said first bit lines of the bit line pairs and said first word lines;
   (d) dummy cells arranged at the intersecting points between said second bit lines of the bit line pairs and said second word lines;
   (e) sense amplifier sections connected to said plurality of pairs of folded bit lines; and
   (f) voltage controller means for, when a selected memory cell which is connected to a selected word line and a first bit line of a selected bit line pair is subjected to data reading, causing a second bit line of said selected bit line pair to be in a low-impedance state in a predetermined time interval after said selected word line is designated and before a sense amplifier section connected to said selected bit line pair is activated, thereby eliminating interference noise applied to said selected bit line pair from a bit line pair adjacent to said selected bit line pair,
   said voltage controller means comprising switching means provided at said dummy cells for selectively connecting each second bit line of the bit line pairs to a constant voltage.

2. A dynamic random access memory comprising:
   (a) a plurality of pairs of bit lines sequentially aligned and respectively including first bit lines and second bit lines which form bit line pairs;
   (b) first and second word lines insulatively intersecting said plurality of pairs of bit lines to provide crossing points therebetween;
   (c) memory cells arranged at crossing points between said first bit lines and said first word lines;
   (d) dummy cells arranged at crossing points between said second bit lines and said second word lines;
   (e) sense amplifier sections connected respectively to said plurality of pairs of bit lines; and
   (f) voltage controller means for, when a selected memory cell which is connected to a selected word line and a first bit line of a selected bit line pair is subjected to data reading, causing neighboring bit lines, adjacent to the first bit line of the selected bit line pair at both sides thereof to be in an electrically separated condition or to be maintain at a preselected voltage potential, thereby eliminating interference noise applied from said neighboring bit lines to said first bit line of the selected bit line pair.

3. The memory according to claim 2, wherein said voltage controller means inactivates sense amplifier sections connected to said neighboring bit lines.

4. The memory according to claim 3, wherein said voltage controller means causes said neighboring bit lines to be fixed to a precharge voltage.

5. The memory according to claim 4, wherein said voltage controller means comprises:
   switching transistor means for disconnecting said selected bit line pair from the precharge voltage before said selected first word line is designated.

6. The memory according to claim 4, wherein said voltage controller means comprises:
   switching transistor means for disconnecting all of the first and second bit lines including said selected bit line pair and said neighboring bit lines from the precharge voltage before said selected first word line is designated.

7. The memory according to claim 1, wherein said switching means comprises a voltage-controlled switching transistor arranged at one of said dummy cells.

8. The memory according to claim 1, wherein said switching means comprises voltage-controlled switching transistors arranged in dummy cells which are associated with one of said second word lines.

9. The memory according to claim 8, wherein said switching transistors comprises field effect transistor having drains which are connected in common to a constant voltage and gates connected together by a wiring line, said field effect transistors being rendered conductive in response to a voltage potential on said wiring line.

10. The memory according to claim 9, wherein each of said field effect transistors has a source thereof connected to a dummy cell transistor of a corresponding one of said dummy cells.

* * * * *